(12) United States Patent
Ueno (10) Patent No.: US 8,368,429 B2
(45) Date of Patent: Feb. 5, 2013

(54) HYSTERESIS COMPARATOR (75) Inventor: Masaji Ueno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 13/048,222

(22) Filed: Mar. 15, 2011

(65) Prior Publication Data

US 2012/0049892 A1    Mar. 1, 2012

(30) Foreign Application Priority Data

Aug. 26, 2010   (JP) .............................. P2010-188952

(51) Int. Cl.
*H03K 5/153*   (2006.01)

(52) U.S. Cl. .......................................... 327/77; 327/206

(58) Field of Classification Search .................. 327/77, 327/81, 89, 205, 206
See application file for complete search history.

(56) References Cited

U.S. PATENT DOCUMENTS

| | | | | |
|---|---|---|---|---|
| 4,375,598 A | * | 3/1983 | Sakai | 327/72 |
| 7,417,471 B2 | * | 8/2008 | Gong et al. | 327/50 |
| 2006/0170462 A1 | * | 8/2006 | Bhattacharya et al. | 327/77 |
| 2006/0214720 A1 | * | 9/2006 | Sobue | 327/359 |

FOREIGN PATENT DOCUMENTS

JP    11-133103    5/1999

* cited by examiner

*Primary Examiner* — Quan Tra
(74) *Attorney, Agent, or Firm* — Turocy & Watson, LLP (57) ABSTRACT

According to one embodiment, a hysteresis comparator is provided with to first to third current sources, a comparison amplifying unit, a reference voltage generating unit, a current mirror circuit, first to fifth N-channel MOS transistors, and first to fifth terminals.

13 Claims, 8 Drawing Sheets

|  | PMT1/PMT2 | NMT4 | NMT3 | NMT6 | Vout |
| --- | --- | --- | --- | --- | --- |
| Vin<Vref | ON/OFF | ON | OFF | OFF | Low |
| Vin>Vref | OFF/ON | OFF | ON | ON | High |

|  | NMT11/NMT12 | PMT14 | PMT13 | PMT16 | Vout |
|---|---|---|---|---|---|
| Vin<Vref | OFF/ON | OFF | ON | ON | Low |
| Vin>Vref | ON/OFF | ON | OFF | OFF | High |

FIG.8

HYSTERESIS COMPARATOR

CROSS REFERENCE TO RELATED APPLICATION

This application is based upon and claims the benefit of priority from the prior Japanese Patent Application No. 2010-188952, filed on Aug. 26, 2010, the entire contents of which are incorporated herein by reference.

FIELD

Embodiments described herein relate to a hysteresis comparator.

BACKGROUND

In a semiconductor integrated circuit for personal and industrial use with a dry cell, a battery or the like used as a power supply, a hysteresis comparator is used for a circuit to monitor a supply voltage, for example. The hysteresis comparator has two different thresholds, and is composed of a bipolar transistor or a BiCMOS.

When the bipolar transistor is used in an output stage of a hysteresis comparator made up of the bipolar transistor or the BiCMOS, it is required to set a base voltage of the output stage to not smaller than a voltage between a base and an emitter at the time of turning on the output stage. There has been a problem in that expanding a threshold setting range for the hysteresis comparator is difficult.

DETAILED DESCRIPTION

According to one embodiment, a hysteresis comparator is provided with a reference voltage generating unit, a comparison amplifying unit, a third transistor, a fourth transistor, a first current source, a fifth transistor, a sixth transistor, a second current source, a seventh transistor, an eighth transistor, and a ninth transistor. The reference voltage generating unit is applied with a first voltage on one end side. The reference voltage generating unit divides the first voltage by use of a plurality of resistors. The reference voltage generating unit generates a reference voltage. The comparison amplifying unit is provided between a high potential power supply and a low potential power supply, and has first and second transistors composed of a differential pair. The first transistor has a gate receiving an input voltage. The second transistor has a gate receiving the reference voltage. The third transistor is provided between the other end of the reference voltage generating unit and the low potential power supply. The fourth transistor is provided between the high potential power supply and the low potential power supply. The fourth transistor has a gate receiving an output signal of the comparison amplifying unit. The first current source has one end connected to the high potential power supply, and allows a first current to flow to the other end side. The fifth transistor has a first terminal connected to the other end of the first current source. The fifth transistor is diode-connected. The sixth transistor is provided between a second terminal of the fifth transistor and the other end of the reference voltage generating unit. The sixth transistor has a gate connected to a gate of the third transistor and a first terminal of the forth transistor. The sixth transistor connects between the second terminal of the fifth transistor and the other end of the reference voltage generating unit based on a potential of the first terminal of the fourth transistor. The second current source has one end connected to the high potential power supply. The second current source allows a second current to flow on the other end side. The second current is n times (n is 2 or larger) as large as the first current. The seventh transistor has a first terminal connected to the other end of the second current source. The seventh transistor has a gate connected to a gate of the fifth transistor. The seventh transistor constitutes a current mirror circuit with the fifth transistor and outputs an output voltage. The eighth and ninth transistors are provided between a second terminal of the seventh transistor and the low potential power supply. The eighth and ninth transistors are cascade-connected, and turn on during operation of the comparison amplifying unit.

Hereinafter, further plural examples are described with reference to the drawings. In the drawings, the same numeral indicates the same or similar portions.

Figure 1:
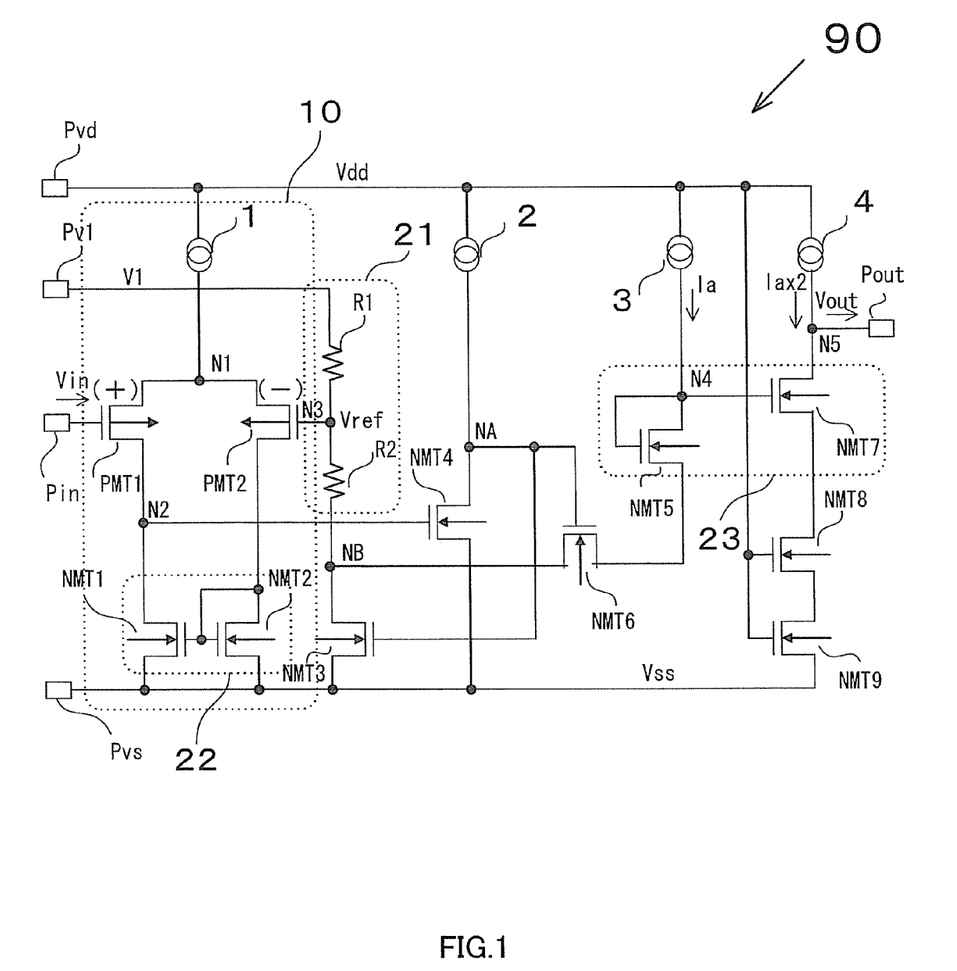
FIG. 1 is a circuit diagram showing a hysteresis comparator according to a first embodiment.
Figure 2:
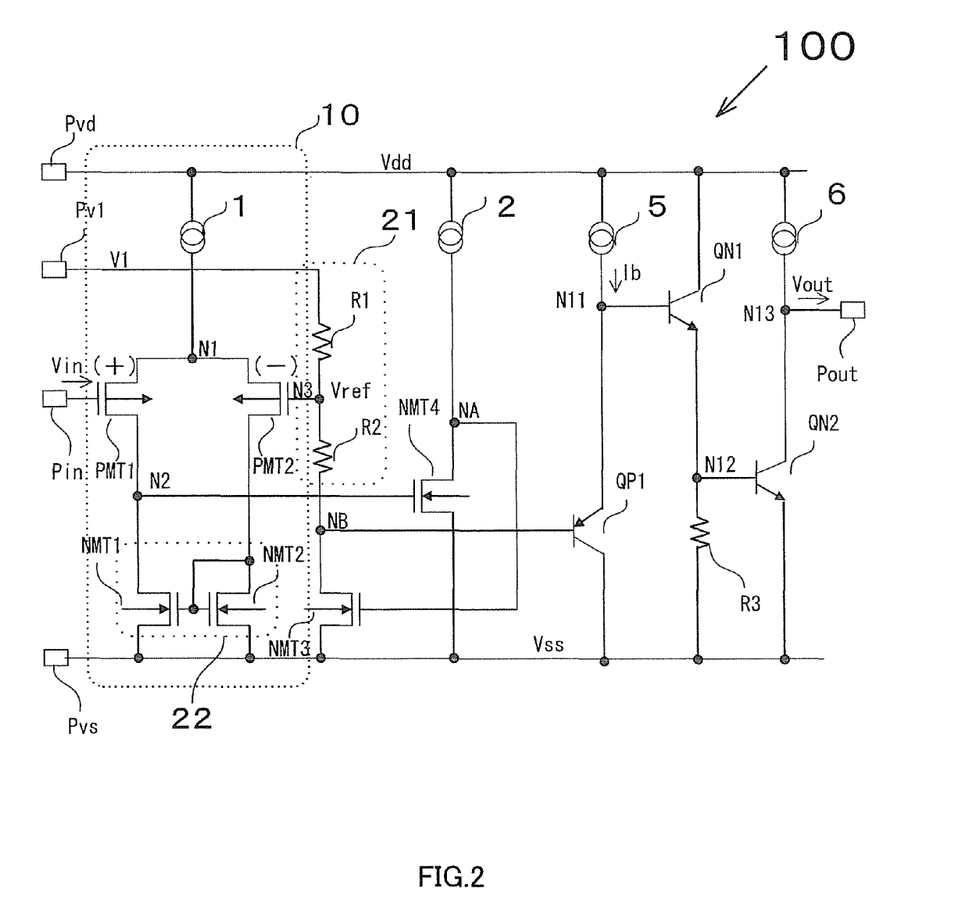
FIG. 2 is a circuit diagram showing a hysteresis comparator of a comparative example according to the first embodiment.

A hysteresis comparator according to a first embodiment is described with reference to the drawings. FIG. 1 is a circuit diagram showing a hysteresis comparator. FIG. 2 is a circuit diagram showing a hysteresis comparator of a comparative example. In the embodiment, a hysteresis comparator is made up of a CMOS, and an output side is formed with a configuration of a current mirror circuit, to expand a threshold setting range.

As shown in FIG. 1, a hysteresis comparator 90 is provided with current sources 2 to 4, a comparison amplifying unit 10, a reference voltage generating unit 21, a current mirror circuit 23, an N-channel MOS transistor NMT3, an N-channel MOS transistor NMT4, an N-channel MOS transistor NMT6, an N-channel MOS transistor NMT8, an N-channel MOS transistor NMT9, a terminal Pvd, a terminal Pv1, a terminal Pin, a terminal Pvs, and a terminal Pout.

The hysteresis comparator 90 is made up of the CMOS, and has two different thresholds. The hysteresis comparator 90 is applied to a circuit to monitor a power supply voltage of a semiconductor integrated circuit for personal and industrial use, for example.

The terminal Pvd supplies a high potential power supply Vdd to the hysteresis comparator 90. The terminal Pv1 outputs a first voltage V1 to the hysteresis comparator 90. The terminal Pin outputs an input voltage Vin to the hysteresis comparator 90. The terminal Pvs is connected to a low potential power supply (ground potential) Vss. The terminal Pout outputs an output voltage Vout.

The reference voltage generating unit 21 is provided with a resistor R1 and a resistor R2. One end of the resistor R1 is applied with a first voltage V1 and the other end of the resistor R1 is connected to a node N3. One end of the resistor R2 is connected to the node N3, and the other end of the resistor R2 is connected to a node NB. The reference voltage generating unit 21 outputs a reference voltage Vref from between the cascade-connected resistors R1 and R2 (node N3) to the comparison amplifying unit 10. It is to be noted that the hysteresis comparator 90 has two different reference voltages as thresholds when in operation (details are described later).

The comparison amplifying unit 10 is provided with a current source 1, a current mirror circuit 22, a P-channel MOS transistor PMT1, and a P-channel MOS transistor PMT2.

One end of the current source 1 is connected to the high potential power supply Vdd, the other end of the current source 1 is connected to a node N1, and the current source 1 allows a current to flow on the other end side.

A source of the P-channel MOS transistor PMT1 is connected to the node N1, a gate of the P-channel MOS transistor PMT1 is inputted with the input voltage Vin, and a drain of the P-channel MOS transistor PMT1 is connected to the node N2. A source of the P-channel MOS transistor PMT2 is connected to the node N1, and a gate of the P-channel MOS transistor PMT2 is inputted with the reference voltage Vref.

The P-channel MOS transistors PMT1 and PMT2 operate as a differential pair. A noninverted output signal of the comparison amplifying unit 10 is outputted from the drain side of the P-channel MOS transistor PMT1 (node N2). Herein, the P-channel MOS transistor PMT1 is indicated as a transistor on the noninverted (+) side, and the P-channel MOS transistor PMT2 is indicated as a transistor on the inverted (−) side.

The current mirror circuit 22 is provided with an N-channel MOS transistor NMT1 and an N-channel MOS transistor NMT2.

A drain of the N-channel MOS transistor NMT1 is connected to the node N2, and a source of the N-channel MOS transistor NMT1 is connected to the low potential power supply (ground potential) Vss. A drain of the N-channel MOS transistor NMT2 is connected to a drain of the P-channel MOS transistor PMT2, a gate of the N-channel MOS transistor NMT2 is connected to a gate of the N-channel MOS transistor NMT1, and a source of the N-channel MOS transistor NMT2 is connected to the low potential power supply (ground potential) Vss.

In the current mirror circuit 22, when a current flows on the N-channel MOS transistor NMT2 side, a current corresponding to the above current flows to the N-channel MOS transistor NMT1 side.

A drain of the N-channel MOS transistor NMT3 (first terminal) is connected to a node NB (the other end of the reference voltage generating unit 21), and a source of the N-channel MOS transistor NMT3 (second terminal) is connected to the low potential power supply (ground potential) Vss.

One end of the current source 2 is connected to the high potential power supply Vdd, the other end of the current source 2 is connected to a node NA, and the current source 2 allows a current to flow on the other end side.

A drain of the N-channel MOS transistor NMT4 (first terminal) is connected to the node NA (the other end of the current source 2), a gate of the N-channel MOS transistor NMT4 (control terminal) is connected to the node N2, and a source of the N-channel MOS transistor NMT4 (second terminal) is connected to the low potential power supply (ground potential) Vss.

Herein, the "first terminal" is taken as a terminal on the high potential power supply Vdd side of the transistor, and the "second terminal" is taken as a terminal on the low potential power supply (ground potential) Vss side. Hereinafter, the same applies to the case of the P-channel MOS transistor.

One end of the current source 3 is connected to the high potential power supply Vdd, the other end of the current source 3 is connected to a node N4, and the current source 3 allows a current Ia to flow on the other end side.

One end of the current source 4 is connected to the high potential power supply Vdd, the other end of the current source 4 is connected to a node N5, and the current source 4 allows a current, twice as large as the current Ia, to flow on the other end side. Although the current twice as large as the current Ia is allowed to flow here, the current may be set to be n times as large as the current Ia (where n is 2 or larger), for example.

The current mirror circuit 23 is provided with an N-channel MOS transistor NMT5 and an N-channel MOS transistor NMT7.

A drain of the N-channel MOS transistor NMT5 (first terminal) is connected to the node N4 (the other end of the current source 3), and a gate of the N-channel MOS transistor NMT5 is connected to a drain so as to be diode-connected.

A drain of the N-channel MOS transistor NMT7 is connected to the node N5, and a gate of the N-channel MOS transistor NMT7 is connected to the gate of the N-channel MOS transistor NMT5. The N-channel MOS transistor NMT7 operates as a transistor in an output stage of the hysteresis comparator 90, and outputs the output voltage Vout from the drain side (node N5) to a terminal Pout.

The N-channel MOS transistor NMT6 is provided between the source of the N-channel MOS transistor NMT5 (second terminal) and the node NB (the other end of the reference voltage generating unit 21), and a gate of the N-channel MOS transistor NMT6 is connected to the node NA and a gate of the N-channel MOS transistor NMT3. The N-channel MOS transistor NMT6 connects between a source of the N-channel MOS transistor NMT5 (second terminal) and the node NB (the other end of the reference voltage generating unit 21) based on a potential of the node NA.

Specifically, the N-channel MOS transistor NMT6 is turned on at the time of the potential of the node NA being at "High" level, to connect between the source of the N-channel MOS transistor NMT5 (second terminal) and the node NB (the other end of the reference voltage generating unit 21). The N-channel MOS transistor NMT6 is turned off at the time of the potential of the node NA being at "Low" level, to shut down between the source of the N-channel MOS transistor NMT5 (second terminal) and the node NB (the other end of the reference voltage generating unit 21).

The cascade-connected N-channel MOS transistors NMT8 and NMT9 are provided between a source of the N-channel MOS transistor NMT7 (second terminal) and the low potential power supply (ground potential) Vss, gates of the N-channel MOS transistors NMT8 and NMT9 are connected to the high potential power supply Vdd, and the N-channel MOS transistors NMT8 and NMT9 constantly turn on during operation of the comparison amplifying unit 10.

As shown in FIG. 2, a hysteresis comparator 100 of the comparative example is provided with the current source 2, a current source 5, a current source 6, the comparison amplifying unit 10, the reference voltage generating unit 21, the N-channel MOS transistor NMT3, the N-channel MOS transistor NMT4, a PNP transistor QP1, an NPN transistor QN1, an NPN transistor QN2, a resistor R3, the terminal Pvd, the terminal Pv1, the terminal Pin, the terminal Pvs, and the terminal Pout.

The hysteresis comparator 100 of the comparative example is made up of a BiCMOS, and has two different thresholds. The hysteresis comparator 100 is different from the hysteresis comparator 90 of the embodiment in that the transistors from the N-channel MOS transistor NMT4 are composed of bipolar transistors. Therefore, only the different respect is described.

One end of the current source 5 is connected to the high potential power supply Vdd, the other end of the current source 5 is connected to a node N11, and the current source 5 allows a current Ib to flow on the other end side.

An emitter of the PNP transistor QP1 is connected to the node N11, a base of the PNP transistor QP1 is connected to the node NB, and a collector of the PNP transistor QP1 is connected to the low potential power supply (ground potential) Vss.

A collector of the NPN transistor QN1 is connected to the high potential power supply Vdd, a base of the NPN transistor QN1 is connected to the node N11, and an emitter of the NPN transistor QN1 is connected to a node N12. One end of the resistor R3 is connected to the node N12, and the other end of the resistor R3 is connected to the low potential power supply (ground potential) Vss.

One end of the current source 6 is connected to the high potential power supply Vdd, the other end of the current source 6 is connected to a node N13, and the current source 6 allows a current to flow on the other end side.

A collector of the NPN transistor QN2 is connected to the node N13, a base of the NPN transistor QN2 is connected to the node N12, and an emitter of the NPN transistor QN2 is connected to the low potential power supply (ground potential) Vss. The NPN transistor QN2 operates as a transistor in the output stage of the hysteresis comparator 100, and outputs the output voltage Vout from the collector side (node N13) to the terminal Pout.

The NPN transistor QN2 does not turn on unless a base potential of the NPN transistor QN2 (potential of the node N12) becomes 0.6 V or more (voltage between base and emitter). To perform on/off operation of the NPN transistor QN2, there is necessity to set a base potential of the PNP transistor QP1 (potential of the node NB) to 0.7 V or more. That is, the reference voltage Vref cannot be set to 0.7 V or less.

Accordingly, the threshold of the hysteresis comparator 100 cannot be set to 0.7 V or less.

Figure 3:
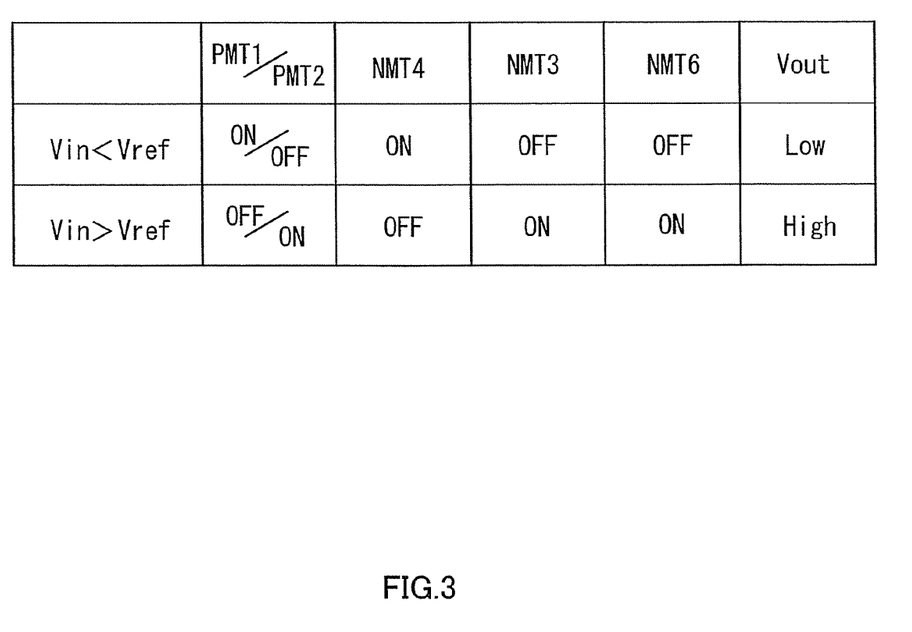
FIG. 3 is a diagram showing a state of a transistor with respect to the relation between an input voltage and a reference voltage according to the first embodiment.

Next, an operation of the hysteresis comparator is described with reference to FIGS. 3 to 6. FIG. 3 is a diagram showing a state of a transistor with respect to the relation between an input voltage and a reference voltage.

As shown in FIG. 3, first, an operation at the time of the input voltage Vin rising from "Low" level (low potential power supply (ground potential) Vss level) is described.

In the region, the P-channel MOS transistor PMT1 is turned on while the P-channel MOS transistor PMT2 is turned off, the P-channel MOS transistors PMT1 and PMT2 make a differential pair, and a noninverted output signal ("High" level) is outputted from the node N2. The N-channel MOS transistor NMT4 turns on since a gate of the N-channel MOS transistor NMT4 is at "High" level. A drain voltage of the N-channel MOS transistor NMT4 (node NA) becomes a voltage being lower than the high potential power supply Vdd and in the vicinity of the low potential power supply (ground potential) Vss.

The N-channel MOS transistors NMT3 and NMT6 turn off since the gates of the N-channel MOS transistors NMT3 and NMT6 are at "Low" level. Hence, a reference voltage Vrefa (voltage of the node N3) to be inputted into the comparison amplifying unit 10 is expressed as $$Vrefa = V1 \qquad \text{Equation (1)}$$

It is to be noted that V1 is a first voltage outputted from the terminal Pv1 to the reference voltage generating unit 21.

Since the N-channel MOS transistor NMT6 turns off, the current mirror circuit 23 does not operate. The N-channel MOS transistor NMT7 in the output stage turns on since the gate of the N-channel MOS transistor NMT7 is at "High" level, and the output voltage Vout is at "Low" level.

Next, an operation to be performed when the input voltage Vin exceeds the first voltage V1 is described.

In the region, the P-channel MOS transistor PMT1 turns off while the P-channel MOS transistor PMT2 turns on, the P-channel MOS transistors PMT1 and PMT2 make a differential pair, and the node N2 is at "Low" level. The N-channel MOS transistor NMT4 turns off since the gate is at "Low" level. The drain voltage of the N-channel MOS transistor NMT4 (node NA) becomes the high potential power supply voltage (Vdd) at "High" level from "Low" level.

The N-channel MOS transistors NMT3 and NMT6 turn on since the gate is at "High" level. Therefore, when an on-resistance of the N-channel MOS transistor NMT3 is referred to as Ron 1, a value of the resistor R1 as r1, a value of the resistor R2 as r2 and the first voltage as V1, a reference voltage Vrefb (voltage of the node N3) to be inputted into the comparison amplifying unit 10 is expressed as $$Vrefb = V1 \times \{(r2 + Ron1)/(r1 + r2 + Ron1)\} \qquad \text{Equation (2)}$$

Herein, since $$r1, r2 >> Ron1 \qquad \text{Equation (3)}$$

has been set, the reference voltage Vrefb can be expressed as $$Vrefb \approx V1 \times \{r2/(r1 + r2)\} < Vrefa \qquad \text{Equation (4)}$$

Since the N-channel MOS transistors NMT3, NMT6, NMT8, NMT9 turn on, the current mirror circuit 23 operates. Since a current flowing through the current source on the output stage side has been set to twice as large as the current Ia flowing on the N-channel MOS transistors NMT5, NMT6, NMT3 side, the output voltage Vout is at "High" level.

Subsequently, although not shown, the output voltage Vout comes to "Low" level when the input voltage Vin becomes not higher than the reference voltage Vrefb.

Since the reference voltage Vrefa and the reference voltage Vrefb are the thresholds of the hysteresis comparator 90, a hysteresis width Vhys of the hysteresis comparator 90 is expressed from Equations (1), (4) as $$Vhys = Vrefa - Vrefb = V1 \times \{r1/(r1 + r2)\} \qquad \text{Equation (5)}$$

Figure 4:
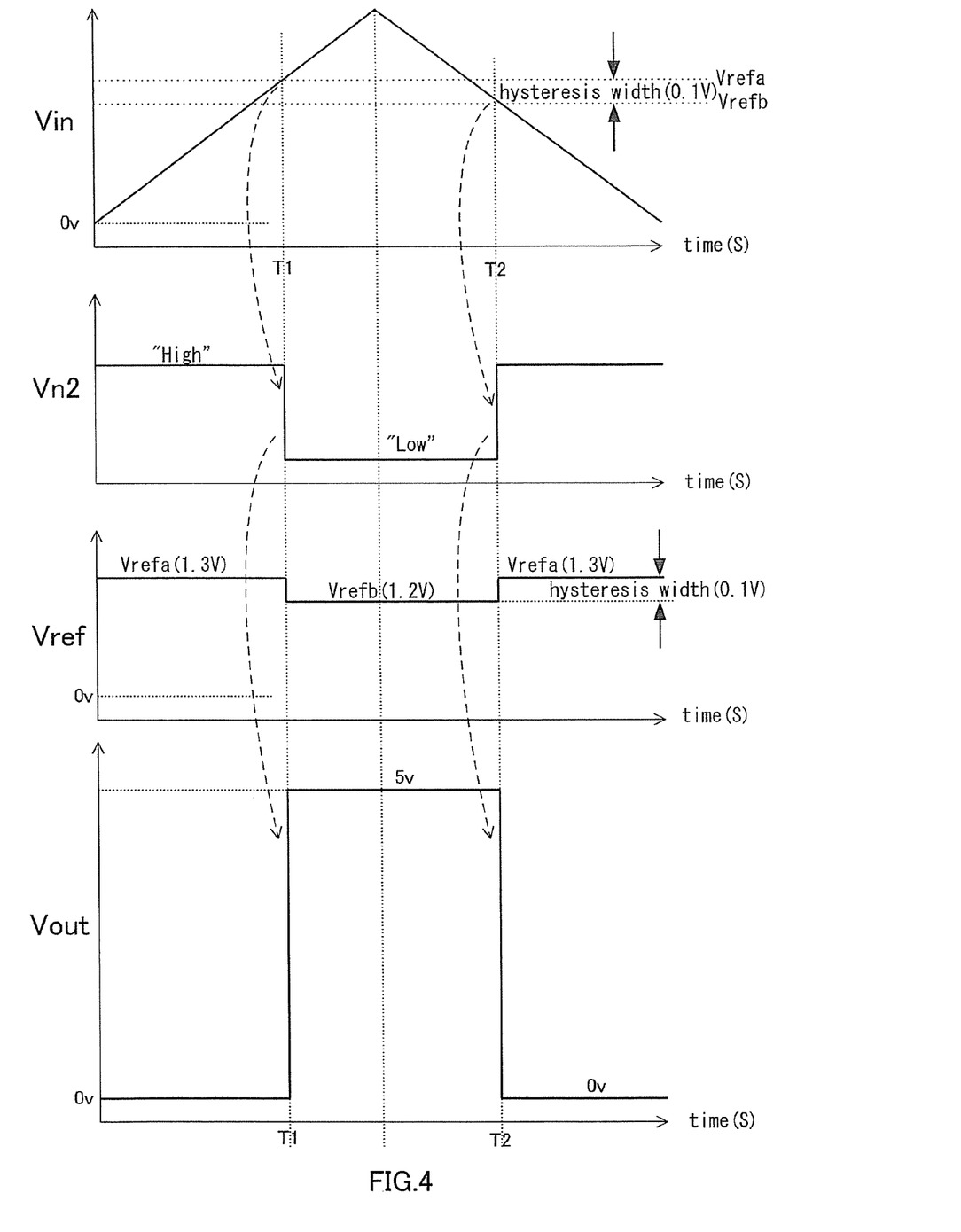
FIG. 4 is a diagram showing an operation of the hysteresis comparator at the time of a first voltage being 1.3 V according to the first embodiment.

FIG. 4 is a diagram showing the operation of the hysteresis comparator at the time of the first voltage V1 being 1.3 V.

As shown in FIG. 4, until time T1 having a relation with Vin<Vref, a potential Vn2 of the node N2 is at "High" level, the reference voltage Vrefa is 1.3 V and the output signal Vout is a ground potential.

During the time T1 to the time T2 being changed the relation of Vin and Vref from Vin>Vref to Vin<Vref, the potential Vn2 of the node N2 is at "Low" level, the reference voltage Vrefb is 1.2 V and the output signal Vout is 5 V at "High" level.

From the time T2 (Vin<Vref), the potential Vn2 of the node N2 is at "High" level, the reference voltage Vrefa is 1.3 V and the output signal Vout is the ground potential. Herein, the hysteresis width Vhys of the hysteresis comparator 90 has been set to 0.1 V. The threshold setting range for the hysteresis comparator 90 is down to 1.2 V (lower limit is 1.2 V).

Figure 5:
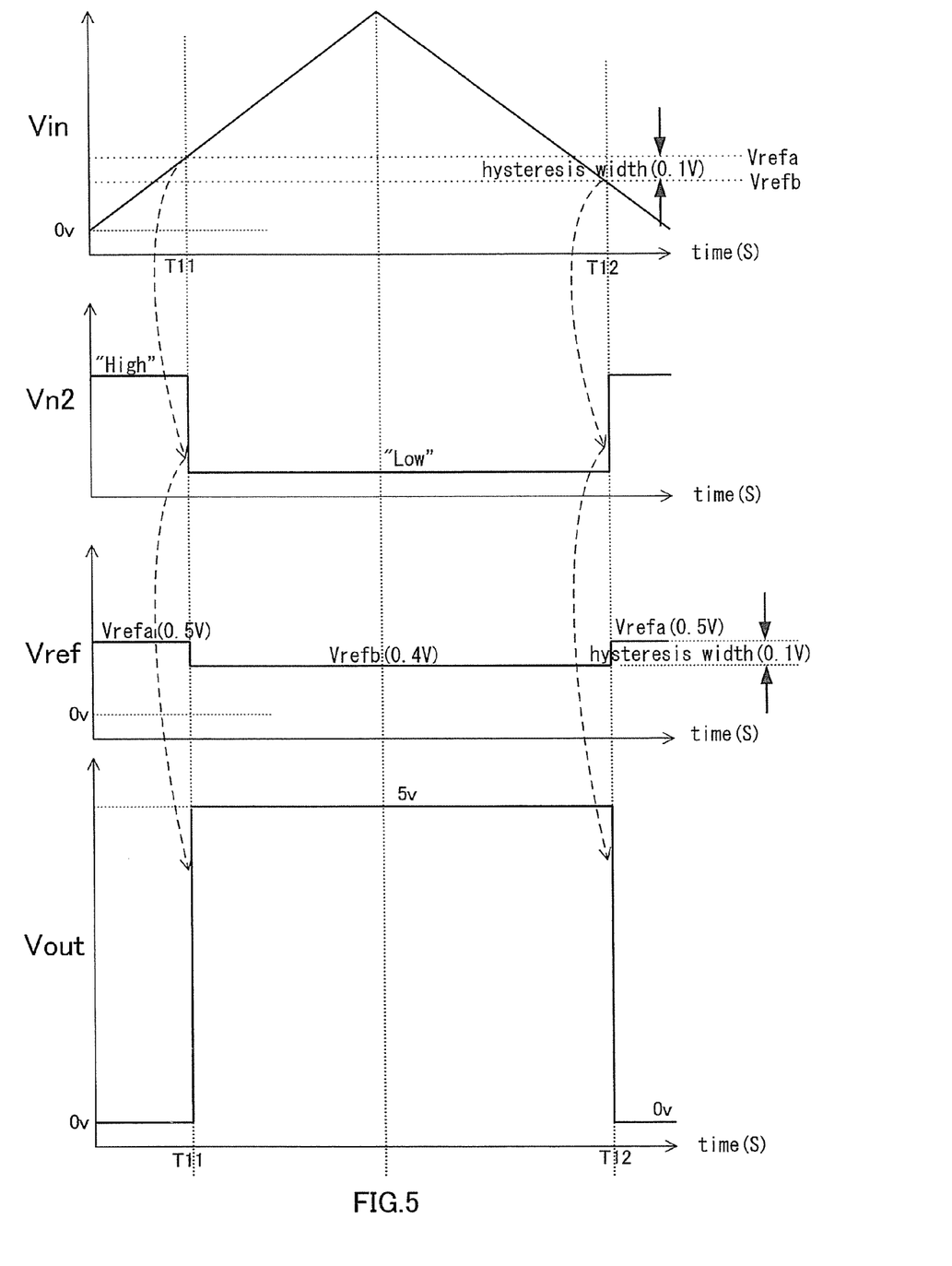
FIG. 5 is a diagram showing an operation of the hysteresis comparator at the time of a first voltage being 0.5 V according to the first embodiment.

FIG. 5 is a diagram showing the operation of the hysteresis comparator at the time of the first voltage V1 being 0.5 V.

As shown in FIG. 5, until time T11 having a relation with Vin<Vref, a potential Vn2 of the node N2 is at "High" level, the reference voltage Vrefa is 0.5 V and the output signal Vout is a ground potential.

During the time T11 to the time T12 being changed the relation of Vin and Vref from Vin>Vref to Vin<Vref, the potential Vn2 of the node N2 is at "Low" level, the reference voltage Vrefb is 0.4V and the output signal Vout is 5 V at "High" level.

From the time T12 (Vin<Vref), the potential Vn2 of the node N2 is at "High" level, the reference voltage Vrefa is 0.5 V and the output signal Vout is the ground potential. Herein, the hysteresis width Vhys of the hysteresis comparator 90 has been set to 0.1 V. The threshold setting range for the hysteresis comparator 90 is down to 0.4 V (lower limit is 0.4 V).

Figure 6:
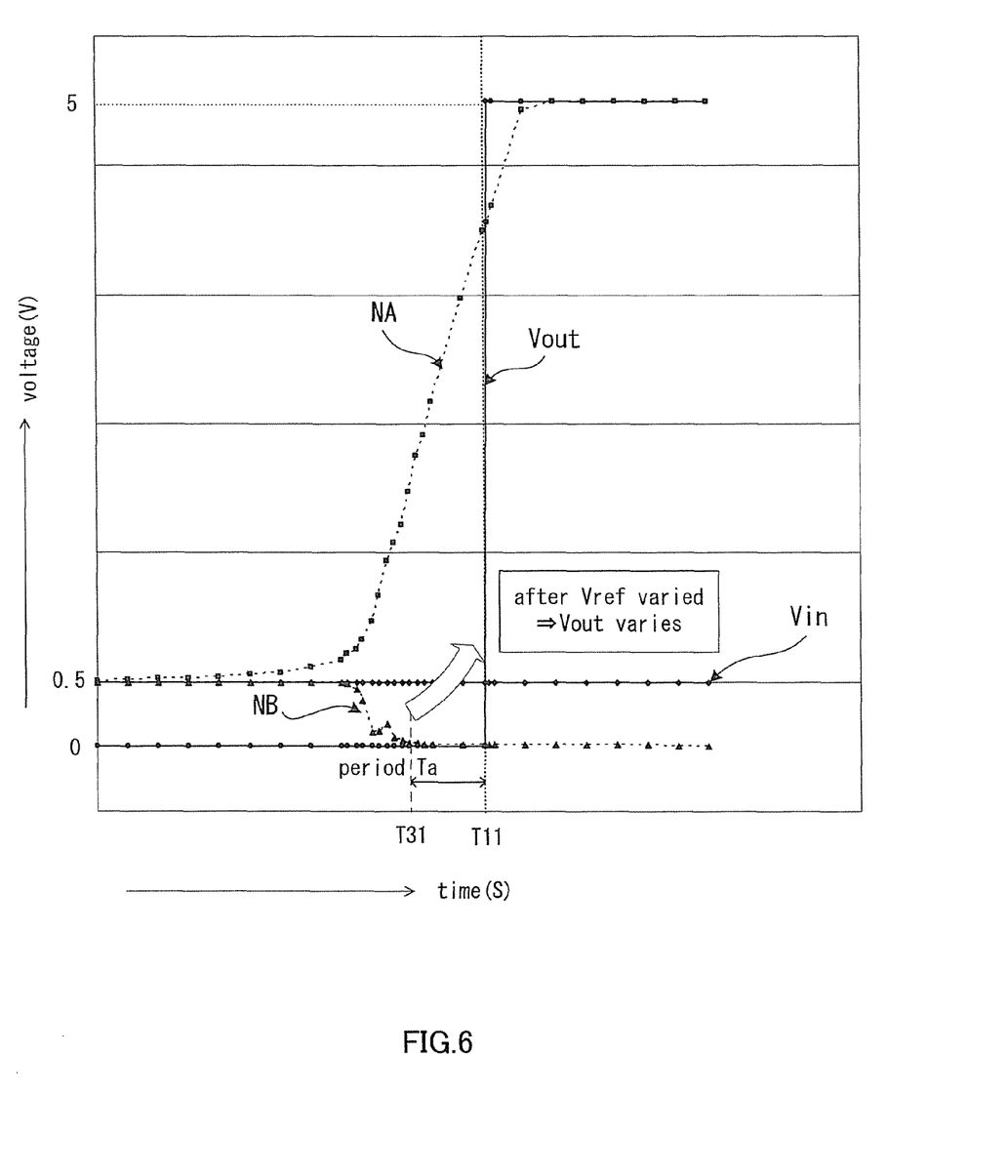
FIG. 6 is a diagram showing changes in reference voltage and output voltage according to the first embodiment.

FIG. 6 is a diagram showing changes in reference voltage and output voltage in the vicinity of the time T11 of FIG. 5.

As shown in FIG. 6, when the P-channel MOS transistor PMT1 changes from on to off, the N-channel MOS transistor NMT4 turn off. With the N-channel MOS transistor NMT4 turned off, the potential of the node NA begins to rise, and when the N-channel MOS transistor NMT3 changes from off to on, the potential of the node NB drops, and then becomes at the low potential power supply (ground potential) Vss level at the time T31. Then, in the N-channel MOS transistor NMT6, a potential of the gate (potential of the node NA) rises, a potential of the node NB as either a source or a drain drops, and then becomes at the low potential power supply (ground potential) Vss level, and the N-channel MOS transistor NMT6 changes from off to on. Consequently, the node N4 and the node NB are connected to each other.

At the time T31, the N-channel MOS transistor NMT3 turns on and the node NB becomes to the low potential power supply (ground potential) Vss level, and thereby, the reference voltage of the node N3 changes from Vrefa to Vrefb. When the N-channel MOS transistors NMT3 and NMT6 turn on, the current mirror circuit 23 operates, and the output signal Vout begins to change from "Low" level to "high" level at the time T11 after time Ta.

Therefore, since the signal level of the output signal Vout changes after switching of the threshold (from Vrefa to Vrefb), occurrence of chattering can be significantly suppressed.

Further, by setting the first voltage V1 and the resistors R1, R2 of the reference voltage generating unit 21 to appropriate values, it is possible to set the threshold of the hysteresis comparator 90 down to 0.1 V, for example.

The reason is that the lower limit of the threshold of the hysteresis comparator 90 depends upon a threshold voltage of the MOS transistor. By setting the threshold voltage of the MOS transistor to a relatively small value, it is possible to set the threshold down to 0.1 V.

Hence in the hysteresis comparator 100 with the BiCMOS configuration of the comparative example, it is not possible set the threshold to a value lower than 0.7 V (potential required for a base potential of the PNP transistor QP1). On the other hand, it is possible to significantly expand the threshold setting region for the hysteresis comparator 90.

As described above, in the hysteresis comparator of the embodiment, the circuit is composed of the CMOS, and the output side is composed of the current mirror circuit 23. The N-channel MOS transistor NMT6 to operate as a switch is provided between the current mirror circuit 23 and the reference voltage generating unit 21.

Accordingly, the threshold setting range for the hysteresis comparator 90 can be more significantly expanded than that of a conventional hysteresis comparator. Further, the occurrence of chattering can be significantly suppressed.

It is to be noted that, although the differential pair of the comparison amplifying unit 10 is composed of the P-channel MOS transistors and the noninverted output signal is outputted to the gate of the N-channel MOS transistor NMT4 in the embodiment, in the case of using the inverted output signal instead, the transistors after the comparison amplifying unit 10 are preferably changed from the N-channel MOS transistors to the P-channel MOS transistors.

Figure 7:
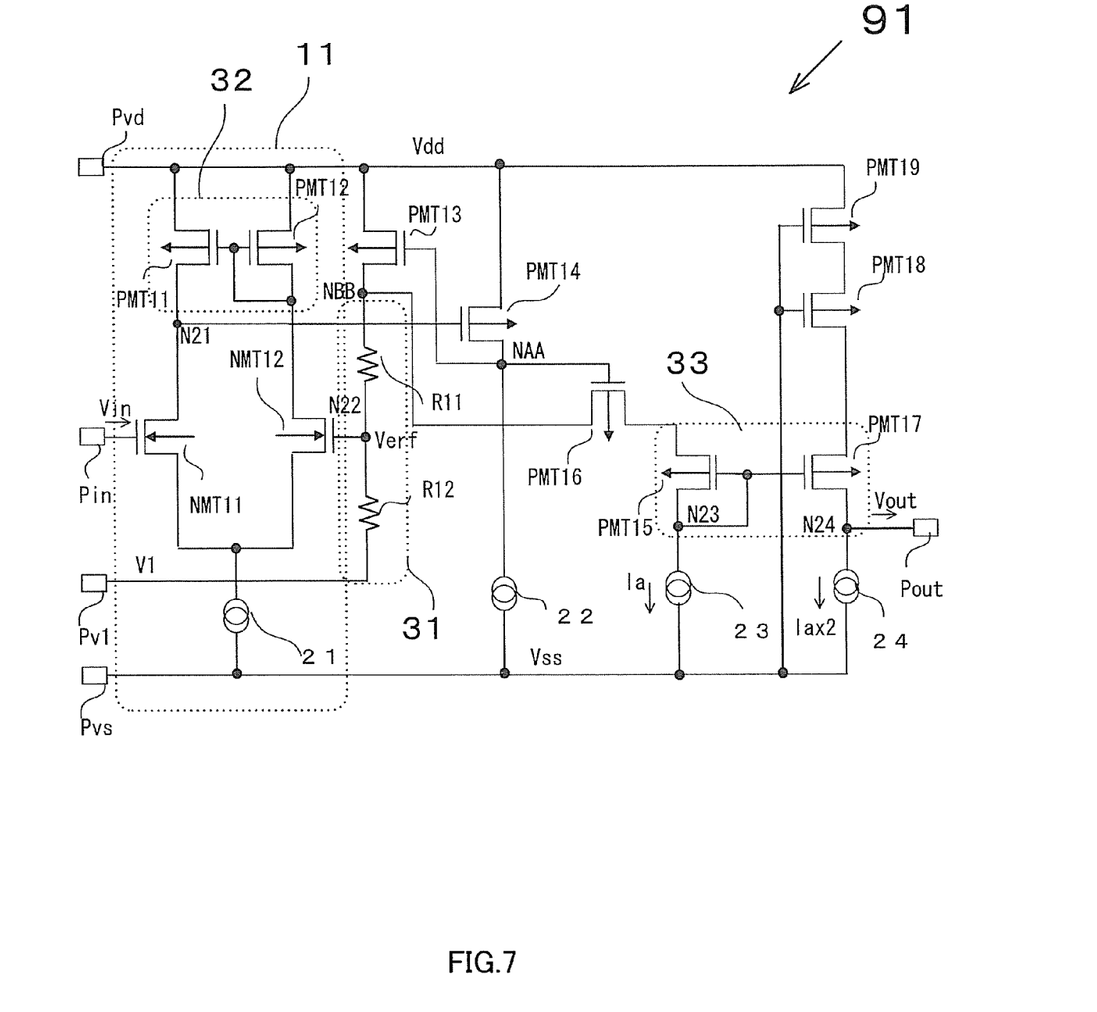
FIG. 7 is a circuit diagram showing a hysteresis comparator according to a second embodiment.

A hysteresis comparator according to a second embodiment is described with reference to the drawings. FIG. 7 is a circuit diagram showing a hysteresis comparator. In the embodiment, the P-channel MOS transistors constituting the hysteresis comparator are replaced by the N-channel MOS transistors, and the N-channel MOS transistors are replaced by the P-channel MOS transistors.

Hereinafter, a portion with the same configuration in the first embodiment is provided with the same numeral, a description of the portion will not be repeated, and only a portion with a different configuration is described.

As shown in FIG. 7, a hysteresis comparator 91 is provided with current sources 22 to 24, a comparison amplifying unit 11, a reference voltage generating unit 31, a current mirror circuit 33, a P-channel MOS transistor PMT13, a P-channel MOS transistor PMT14, a P-channel MOS transistor PMT16, a P-channel MOS transistor PMT18, a P-channel MOS transistor PMT19, the terminal Pvd, the terminal Pv1, the terminal Pin, the terminal Pvs, and the terminal Pout.

The hysteresis comparator 91 is composed of the CMOS, and has two different thresholds. The hysteresis comparator 91 is applied to a circuit for monitoring a supply voltage of a semiconductor integrated circuit for personal and industrial use, for example.

The reference voltage generating unit 31 is provided with a resistor R11 and a resistor R12. One end of the resistor R12 is applied with the first voltage V1 and the other end of the resistor R12 is connected to a node N22. One end of the resistor R11 is connected to the node N22, and the other end of the resistor R11 is connected to a node NBB. The reference voltage generating unit 31 outputs the reference voltage Vref from between the cascade-connected resistors R11 and R12 (Node N22) to the comparison amplifying unit 11. It is to be noted that the hysteresis comparator 91 has two different reference voltages as thresholds during operation (details are described later).

The comparison amplifying unit 11 is provided with a current source 21, a current mirror circuit 32, an N-channel MOS transistor NMT11, and an N-channel MOS transistor NMT12.

The current mirror circuit 32 is provided with a P-channel MOS transistor PMT11 and a P-channel MOS transistor PMT12.

A source of the P-channel MOS transistor PMT11 is connected to the high potential power supply Vdd, and a drain of the P-channel MOS transistor PMT11 is connected to a node N21. A source of the P-channel MOS transistor PMT12 is connected to the high potential power supply Vdd, and a gate of the P-channel MOS transistor PMT12 is connected to a drain of the P-channel MOS transistor PMT12 and a gate of the P-channel MOS transistor PMT11.

In the current mirror circuit 32, when a current flows on the P-channel MOS transistor PMT12 side, a current corresponding to the above current flows to the P-channel MOS transistor PMT11 side.

A drain of the N-channel MOS transistor NMT11 is connected to the node N21, and a gate of the N-channel MOS transistor NMT11 is inputted with the input voltage Vin. A drain of the N-channel MOS transistor NMT12 is connected to a drain of the P-channel MOS transistor PMT12, and the reference voltage Vref is inputted to a gate of the N-channel MOS transistor NMT12.

The N-channel MOS transistors NMT11 and NMT12 operate as a differential pair. A noninverted output signal of the comparison amplifying unit 11 is outputted from the drain side of the N-channel MOS transistor NMT11 (node N21). Herein, the N-channel MOS transistor NMT11 is noted as a transistor on the noninverted (+) side, and the N-channel MOS transistor NMT12 is noted as a transistor on the inverted (−) side.

One end of the current source 21 is connected to the sources of the N-channel MOS transistors NMT11 and NMT12, the other end of the current source 21 is connected to the low potential power supply (ground potential) Vss, and the current source 21 allows a current to flow on the other end side.

A source of the P-channel MOS transistor PMT13 (first terminal) is connected to the high potential power supply Vdd, and a drain of the P-channel MOS transistor PMT13 is connected to the node NBB (the other end of the reference voltage generating unit 31).

A source of the P-channel MOS transistor PMT14 (first terminal) is connected to the high potential power supply Vdd, a gate of the P-channel MOS transistor PMT14 is connected to the node N21, and a drain of the P-channel MOS transistor PMT14 is connected to a gate of the P-channel MOS transistor PMT13 and the node NAA.

One end of the current source 22 is connected to the node NAA, and the other end of the current source 22 is connected to the low potential power supply (ground potential) Vss, and the current source 22 allows a current to flow on the other end side.

The cascade-connected P-channel MOS transistors PMT18 and PMT 19 are provided between the high potential power supply Vdd and the current mirror circuit 33, gates of the P-channel MOS transistors PMT18 and PMT19 are connected to the low potential power supply (ground potential) Vss, and the P-channel MOS transistors PMT18 and PMT 19 constantly turn on during operation of the comparison amplifying unit 11.

The current mirror circuit 33 is provided with a P-channel MOS transistor PMT15 and a P-channel MOS transistor PMT17.

A P-channel MOS transistor PMT15 is a diode-connected transistor with a gate connected to a node N23 and a drain of the P-channel MOS transistor PMT15.

A source of the P-channel MOS transistor PMT17 (first terminal) is connected to the drain of the P-channel MOS transistor PMT18, a gate of the P-channel MOS transistor PMT17 is connected to the gate of the P-channel MOS transistor PMT15 (node N23), and a drain of the P-channel MOS transistor PMT17 (second terminal) is connected to a node N24. The P-channel MOS transistor PMT17 operates as a transistor in the output stage of the hysteresis comparator 91, and outputs the output voltage Vout from the drain side (node N24) to the terminal Pout.

One end of the current source 23 is connected to the node N23, and the other end of the current source 23 is connected to the low potential power supply (ground potential) Vss, and the current source 23 allows the current Ia to flow on the other end side.

One end of the current source 24 is connected to the node N24, the other end of the current source 24 is connected to the low potential power supply (ground potential) Vss, and the current source 24 allows a current, twice as large as the current Ia, to flow on the other end side. Although the current twice as large as the current Ia is allowed to flow here, the current may be set to be n times as large as the current Ia (where n is 2 or larger), for example.

The P-channel MOS transistor PMT16 is provided between the source of the P-channel MOS transistor PMT15 (first terminal) and the node NBB (the other end of the reference voltage generating unit 31), and a gate of the P-channel MOS transistor PMT16 is connected to the node NAA and a gate of the P-channel MOS transistor PMT3. The P-channel MOS transistor PMT16 connects between a source of the P-channel MOS transistor PMT15 (first terminal) and the node NBB (the other end of the reference voltage generating unit 31) based on a potential of the node NAA.

Specifically, the P-channel MOS transistor PMT16 turn on at the time of the potential of the node NAA being at "Low" level, and connect between the source of the P-channel MOS transistor PMT15 and the node NBB (the other end of the reference voltage generating unit 31). The P-channel MOS transistor PMT16 turn off at the time of the potential of the node NAA being at "High" level, and shut down between the source of the P-channel MOS transistor PMT15 (first terminal) and the node NBB (the other end of the reference voltage generating unit 31).

Figure 8:
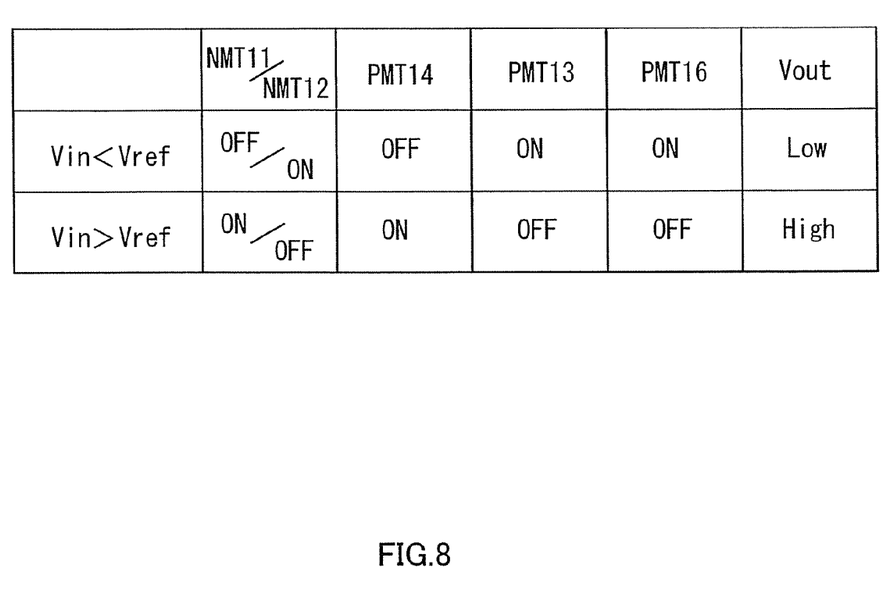
FIG. 8 is a diagram showing a state of a transistor with respect to the relation between an input voltage and a reference voltage according to the second embodiment.

Next, an operation of the hysteresis comparator is described with reference to FIG. 8. FIG. 8 is a diagram showing a state of a transistor with respect to the relation between an input voltage and a reference voltage.

As shown in FIG. 8, first, an operation at the time of the input voltage Vin rising from "Low" level (low potential power supply (ground potential) Vss level) is described.

In the region, the N-channel MOS transistor NMT11 turn off while the N-channel MOS transistor NMT12 turn on, the N-channel MOS transistors NMT11 and NMT12 make a differential pair, and a noninverted output signal ("High" level) is outputted from the node N21. The P-channel MOS transistor PMT14 turns off since a gate of the P-channel MOS transistor PMT14 is at "High" level. A drain of the P-channel MOS transistor PMT14 (node NAA) comes to "Low" level.

The P-channel MOS transistors PMT13 and PMT16 turn on since gates are at "Low" level.

Since the P-channel MOS transistors PMT13, PMT16, PMT18, PMT19 turn on, the current mirror circuit 33 operates. Since a current flowing through the current source on the output stage side has been set to twice as large as the current Ia flowing on the P-channel MOS transistors PMT13, PMT16, PMT15 side, the output voltage Vout is at "Low" level.

In the region, when an on-resistance of the P-channel MOS transistor PMT13 is referred to as Ron 11, a value of the resistor R11 as r11, a value of the resistor R12 as r12, the first voltage as V1 and the high potential power supply as Vdd, since $$Vdd > V1 \qquad \text{Equation (6)}$$

has been set, a reference voltage Vrefaa (voltage of the node N22) to be inputted into the comparison amplifying unit 11 is expressed as $$Vrefaa = (Vdd - V1) \times \{(r12)/(r11 + r12 + Ron11)\} \qquad \text{Equation (7)}$$

Herein, since $$r11, r12 \gg Ron11 \qquad \text{Equation (8)}$$

has been set, the reference voltage Vrefaa can be expressed as $$Vrefaa \approx (Vdd - V1) \times \{r12/(r11 + r12)\} \qquad \text{Equation (9)}$$

Subsequently, an operation at the time of the input voltage Vin exceeding the first voltage V1 is described.

In the region, the N-channel MOS transistor NMT11 turn on while the N-channel MOS transistor NMT12 turn off, the N-channel MOS transistors NMT11 and NMT12 make a differential pair, and the node N21 comes to "Low" level. The P-channel MOS transistor PMT14 turn on since the gate is at "Low" level. The drain of the P-channel MOS transistor PMT14 (node NAA) comes to "High" level. The P-channel MOS transistors PMT13 and PMT16 turn off since the gates are at "High" level.

Since the P-channel MOS transistors PMT13, PMT16 turn off, the current mirror circuit 33 does not operate. Hence the P-channel MOS transistor PMT17 comes to "Low" level, and the P-channel MOS transistor PMT17 turn on. Consequently, the output voltage Vout at the node N22 comes to "High" level.

In the region, a reference voltage Vrefbb (voltage of the node N22) to be inputted into the comparison amplifying unit 11 is expressed as $$Vrefbb = V1 \qquad \text{Equation (10)}$$

Herein, in order to have a similar hysteresis characteristic as in the first embodiment, $$Vrefaa > Vrefbb \qquad \text{Equation (11)}$$

is set. More specifically, the on-resistance Ron 11 of the P-channel MOS transistor PMT13, the value r11 of the resistor R11, the value r12 of the resistor R12, the first voltage V1, and the value of the high potential power supply Vdd are set to appropriate values. The setting allows setting of the threshold down to 0.1 V, for example, as in the first embodiment. It should be noted that a description hereinafter will not be repeated since being similar to in the first embodiment.

As described above, in the hysteresis comparator of the embodiment, the circuit is composed of the CMOS, and the output side is composed of the current mirror circuit 33. Between the current mirror circuit 33 and the reference voltage generating unit 31, the P-channel MOS transistor PMT16 to operate as a switch is provided.

Therefore, the threshold setting range for the hysteresis comparator 91 can be more significantly expanded than that of a conventional hysteresis comparator. Further, the occurrence of chattering can be significantly suppressed.

Although the hysteresis comparator is composed of the MOS transistors in the embodiments, an MIS transistor may be used instead, the MIS transistor having a gate insulating film composed of a complex film made of a silicon oxide film and another insulating film or an insulating film other than a silicon oxide film.

Further, although the noninverted output signal of the comparison amplifying unit 11 is used in the second embodiment, in the case of using the inverted output signal, configurations of the transistors from the comparison amplifying unit 11 are preferably changed from the P-channel MOS transistors to the N-channel MOS transistors.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A hysteresis comparator, comprising:
a reference voltage generating unit to be applied with a first voltage on one end side, the reference voltage generating unit to divide the first voltage by use of a plurality of resistors, the reference voltage generating unit to generate a reference voltage;
a comparison amplifying unit provided between a high potential power supply and a low potential power supply, the comparison amplifying unit having first and second transistors composing of a differential pair, the first transistor having a gate receiving an input voltage, the second transistor having a gate receiving the reference voltage;
a third transistor provided between the other end of the reference voltage generating unit and the low potential power supply;
a fourth transistor provided between the high potential power supply and the low potential power supply, the fourth transistor having a gate receiving an output signal of the comparison amplifying unit;
a first current source having one end connected to the high potential power supply, the first current to allow a first current to flow to the other end side;
a fifth transistor having a first terminal connected to the other end of the first current source, the fifth transistor being diode-connected;
a sixth transistor provided between a second terminal of the fifth transistor and the other end of the reference voltage generating unit, the sixth transistor having a gate connected to a gate of the third transistor and a first terminal of the forth transistor, the sixth transistor to connect between the second terminal of the fifth transistor and the other end of the reference voltage generating unit based on a potential of the first terminal of the fourth transistor;
a second current source having one end connected to the high potential power supply, the second current source to allow a second current to flow to the other end side, the second current being n times (n is 2 or larger) as large as the first current;
a seventh transistor having a first terminal connected to the other end of the second current source, the seventh transistor having a gate connected to a gate of the fifth transistor, the seventh transistor to constitute a current mirror circuit with the fifth transistor, the seventh transistor to output an output voltage; and
eighth and ninth transistors provided between a second terminal of the seventh transistor and the low potential power supply, the eighth and ninth transistors being cascade-connected, the eighth and ninth transistors to turn on during an operation of the comparison amplifying unit.

2. The hysteresis comparator according to claim 1, wherein the first and second transistors are P-channel MOS transistors, an output signal of the comparison amplifying unit is a noninverted output signal, and the third to ninth transistors are N-channel MOS transistors.

3. The hysteresis comparator according to claim 2, wherein the comparison amplifying unit further includes a third current source, a first N-channel MOS transistor and a second N-channel MOS transistor,
one end of the third current source is connected to the high potential power supply, the other end of the third current source is connected to first terminals of the first and second transistors, and the third current source allows a third current to flow to the first terminal sides of the first and second transistors,
a first terminal of the first N-channel MOS transistor is connected to a second terminal of the first transistor, and a second terminal of the first N-channel MOS transistor is connected to the low potential power supply, and
a first terminal of the second N-channel MOS transistor is connected to a second terminal of the second transistor, a gate of the second N-channel MOS transistor is connected to the first terminal of the second N-channel MOS transistor and a gate of the first N-channel MOS transistor, and a second terminal of the second N-channel MOS transistor is connected to the low potential power supply.

4. The hysteresis comparator according to claim 3, further comprising
a forth current source having one terminal connected to the high potential power supply, the forth current source having the other end connected to a first terminal of the fourth transistor, the forth current source to allow a forth current to flow to the first terminal side of the fourth transistor.

5. The hysteresis comparator according to claim 1, wherein the first and second transistors are N-channel MOS transistors, an output signal of the comparison amplifying unit is a inverted output signal, and the third to ninth transistors are N-channel MOS transistors.

6. The hysteresis comparator according to claim 1, wherein the comparison amplifying unit is composed of cascade-connected first and second resistors,
the gate of the second transistor is connected between the first and second resistors, and
when a value of the first resistor is referred to as R1, a value of the second resistor as R2, the first voltage as V1 and a hysteresis width of the hysteresis comparator as Vhys, the hysteresis width is expressed as $Vhys=V1\times\{R1+R2)\}$.

7. The hysteresis comparator according to claim 1, wherein, after a level of the output signal of the comparison amplifying unit changed and then the reference voltage changed due to a hysteresis operation, the level of the output signal changes.

8. A hysteresis comparator, comprising:
a reference voltage generating unit to be applied with a first voltage on one end side, the reference voltage generating unit to divide the first voltage by use of a plurality of resistors, the reference voltage generating unit to generate a reference voltage;
a comparison amplifying unit provided between a high potential power supply and a low potential power supply, the comparison amplifying unit having first and second transistors composing of a differential pair, the first transistor having a gate receiving an input voltage, the second transistor having a gate receiving the reference voltage;
a third transistor provided between the high potential power supply and the other end of the reference voltage generating unit;
a fourth transistor provided between the high potential power supply and the low potential power supply, the fourth transistor having a gate receiving an output signal of the comparison amplifying unit;
a fifth transistor having a second terminal connected to a gate of the fifth transistor, the fifth transistor being diode-connected;
a first current source having one end connected to the second terminal of the fifth transistor, the first current source having the other end connected to the low potential power supply, the first current source to allow a first current to flow to the other end side;
a sixth transistor provided between a first terminal of the fifth transistor and the other end of the reference voltage generating unit, the sixth transistor having a gate connected to a gate of the third transistor and a second terminal of the fourth transistor, the sixth transistor to connect between the first terminal of the fifth transistor and the other end of the reference voltage generating unit based on a potential of a second terminal of the fourth transistor;
a seventh transistor having a gate connected to the gate of the fifth transistor, the seventh transistors to constitute a current mirror circuit with the fifth transistor, the seventh transistor to output an output voltage;
eighth and ninth transistors provided between the high potential power supply and a first terminal of the seventh transistor, the eighth and ninth transistors being cascade-connected, the eighth and ninth transistors to turn on during an operation of the comparison amplifying unit; and
a second current source having one end connected to a second terminal of the seventh transistor, the second current source having the other end connected to low high potential power supply, the second current source to allow a second current to flow to the other end side, the second current being n times (n is 2 or larger) as large as the first current.

9. The hysteresis comparator according to claim 8, wherein the first and second transistors are N-channel MOS transistors, an output signal of the comparison amplifying unit is a noninverted output signal, and the third to ninth transistors are P-channel MOS transistors.

10. The hysteresis comparator according to claim 9, wherein
the comparison amplifying unit further includes a third current source, a first P-channel MOS transistor and a second P-channel MOS transistor,
one end of the third current source is connected to second terminals of the first and second transistors, the other end of the third current source is connected to the low potential power supply, and the third current source allows a third current to flow to the low potential power supply,
a first terminal of the first P-channel MOS transistor is connected to the high potential power supply, and a second terminal of the first P-channel MOS transistor is connected to a first terminal of the first transistor, and
a first terminal of the second P-channel MOS transistor is connected to the high potential power supply, a gate of the second P-channel MOS transistor is connected to a second terminal of the second P-channel MOS transistor and a gate of the first P-channel MOS transistor, and the second terminal of the first P-channel MOS transistor is connected to the first terminal of the second transistor.

11. The hysteresis comparator according to claim 10, further comprising
a fourth current source having one terminal connected to a second terminal of the fourth transistor, the fourth current source having the other end connected to the low potential power supply, the fourth current source to allow a fourth current to flow to the low potential power supply side.

12. The hysteresis comparator according to claim 8, wherein
the comparison amplifying unit is composed of cascade-connected first and second resistors,
the gate of the second transistor is connected between the first and second resistors, and
when a value of the first resistor is referred to as R1, a value of the second resistor as R2, the first voltage as V1 and a hysteresis width of the hysteresis comparator as Vhys, the hysteresis width is expressed as $Vhys=V1\times\{R1/(R1+R2)\}$.

13. The hysteresis comparator according to claim 8, wherein, after a level of the output signal of the comparison amplifying unit changed and then the reference voltage changed due to a hysteresis operation, the level of the output signal changes.

* * * * *